(12) United States Patent
de Souza et al.

(10) Patent No.: US 10,164,014 B2
(45) Date of Patent: Dec. 25, 2018

(54) MOSFET WITH ULTRA LOW DRAIN LEAKAGE

(71) Applicant: INTERNATIONAL BUSINESS MACHINES CORPORATION, Armonk, NY (US)

(72) Inventors: Joel P. de Souza, Putnam Valley, NY (US); Keith E. Fogel, Hopewell Junction, NY (US); Jeehwan Kim, Cambridge, MA (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 73 days.

(21) Appl. No.: 15/287,854

(22) Filed: Oct. 7, 2016

(65) Prior Publication Data

US 2017/0033203 A1    Feb. 2, 2017

Related U.S. Application Data

(62) Division of application No. 14/814,142, filed on Jul. 30, 2015, now Pat. No. 9,536,945.

(51) Int. Cl.
| | |
|---|---|
| *H01L 21/02* | (2006.01) |
| *H01L 21/28* | (2006.01) |
| *H01L 23/31* | (2006.01) |
| *H01L 29/06* | (2006.01) |
| *H01L 29/08* | (2006.01) |

(Continued)

(52) U.S. Cl.
CPC .... *H01L 29/0847* (2013.01); *H01L 21/02554* (2013.01); *H01L 21/02565* (2013.01); *H01L 21/28264* (2013.01); *H01L 23/3171* (2013.01); *H01L 29/0603* (2013.01); *H01L 29/0638* (2013.01); *H01L 29/0653* (2013.01); *H01L 29/22* (2013.01); *H01L 29/247* (2013.01); *H01L 29/267* (2013.01); *H01L 29/66636* (2013.01); *H01L 29/78* (2013.01); *H01L 29/78603* (2013.01); *H01L 21/02576* (2013.01); *H01L 21/28114* (2013.01); *H01L 23/291* (2013.01);

(Continued)

(58) Field of Classification Search
None
See application file for complete search history.

(56) References Cited

U.S. PATENT DOCUMENTS

| | | |
|---|---|---|
| 5,068,200 A | 11/1991 | Kang et al. |
| 5,482,876 A | 1/1996 | Hsieh et al. |

(Continued)

OTHER PUBLICATIONS

List of IBM Patents or Patent Applications Treated as Related dated Oct. 7, 2016, 2 pages.

(Continued)

*Primary Examiner* — Erik T Peterson
(74) *Attorney, Agent, or Firm* — Tutunjian & Bitetto, P.C.; Louis J. Percello (57) ABSTRACT

A semiconductor device includes a monocrystalline substrate configured to form a channel region between two recesses in the substrate. A gate conductor is formed on a passivation layer over the channel region. Dielectric pads are formed in a bottom of the recesses and configured to prevent leakage to the substrate. Source and drain regions are formed in the recesses on the dielectric pads from a deposited non-crystalline n-type material with the source and drain regions making contact with the channel region.

20 Claims, 4 Drawing Sheets

(51) Int. Cl.
  *H01L 29/22*     (2006.01)
  *H01L 29/24*     (2006.01)
  *H01L 29/267*    (2006.01)
  *H01L 29/66*     (2006.01)
  *H01L 29/78*     (2006.01)
  *H01L 29/786*    (2006.01)
  *H01L 29/423*    (2006.01)
  *H01L 23/29*     (2006.01)

(52) U.S. Cl.
  CPC .. *H01L 29/42376* (2013.01); *H01L 29/66727* (2013.01)

(56) References Cited

U.S. PATENT DOCUMENTS

| | | | |
|---|---|---|---|
| 5,620,912 A * | 4/1997 | Hwang | H01L 29/0653 257/E21.431 |
| 6,037,605 A * | 3/2000 | Yoshimura | H01L 29/0653 257/25 |
| 6,291,845 B1 | 9/2001 | Blanchard | |
| 6,593,174 B2 | 7/2003 | Blanchard | |
| 6,977,419 B2 | 12/2005 | Wang et al. | |
| 7,358,574 B2 | 4/2008 | Choi | |
| 7,482,656 B2 | 1/2009 | Luo et al. | |
| 7,514,304 B2 | 4/2009 | Howard | |
| 7,619,248 B1 | 11/2009 | Cleeves | |
| 7,824,993 B2 | 11/2010 | Holz et al. | |
| 8,039,835 B2 | 10/2011 | Ichikiwa et al. | |
| 8,169,029 B2 | 5/2012 | Wu | |
| 8,278,176 B2 | 10/2012 | Bauer et al. | |
| 8,680,646 B2 | 3/2014 | Guo et al. | |
| 8,742,453 B2 | 6/2014 | Chan | |
| 8,877,574 B1 | 11/2014 | Basu et al. | |
| 8,912,070 B2 | 12/2014 | Ma et al. | |
| 8,999,795 B2 | 4/2015 | Basker et al. | |
| 9,136,329 B2 | 9/2015 | Huang et al. | |
| 9,230,802 B2 | 1/2016 | Tripathi et al. | |
| 9,601,574 B2 | 3/2017 | Kwok et al. | |
| 2003/0136985 A1* | 7/2003 | Murthy | H01L 29/66636 257/288 |
| 2005/0148148 A1* | 7/2005 | Cheng | H01L 21/823481 438/299 |
| 2006/0131648 A1* | 6/2006 | Ahn | H01L 29/66636 257/347 |
| 2007/0032024 A1* | 2/2007 | Peidous | H01L 29/66628 438/299 |
| 2007/0278591 A1* | 12/2007 | Luo | H01L 29/0653 257/374 |
| 2008/0012018 A1* | 1/2008 | Waite | H01L 21/823807 257/69 |
| 2008/0061385 A1 | 3/2008 | Joo | |
| 2009/0057763 A1* | 3/2009 | Minami | H01L 21/84 257/347 |
| 2009/0081837 A1* | 3/2009 | Shi | H01L 21/823807 438/231 |
| 2009/0104739 A1* | 4/2009 | Ye | H01L 21/02532 438/197 |
| 2009/0212286 A1 | 8/2009 | Benzarti | |
| 2013/0119370 A1* | 5/2013 | Wu | H01L 21/3065 257/43 |
| 2013/0140576 A1 | 6/2013 | Mieno et al. | |
| 2017/0186911 A1 | 6/2017 | Otto et al. | |

OTHER PUBLICATIONS

Office Action dated Mar. 30, 2017 in U.S. Appl. No. 15/292,747.
Office Action issued in U.S. Appl. No. 15/292,747 dated Sep. 29, 2017, pp. 1-9.

* cited by examiner

MOSFET WITH ULTRA LOW DRAIN LEAKAGE

BACKGROUND

Technical Field

The present invention relates to semiconductor processing, and more particularly to devices and methods that grow source and drain regions on dielectric materials.

Description of the Related Art

Metal oxide semiconductor field effect transistors (MOSFETs) often suffer from performance loss due to carrier leakage. One of the major leakage sources of MOSFET devices is drain-to-substrate leakage. Here, charge from the drain leaks into the substrate. This is made even more severe when epitaxially grown layers (epilayers) have defects. One method for addressing leakage into the substrate of the device is to provide a buried oxide layer. In a silicon-on-insulator (SOI) structure, a buried oxide layer is disposed between a base (bulk) substrate and a thin silicon layer. The devices are formed in the thin silicon layer, which is isolated from the base substrate by the buried oxide layer. Conventional source and drain regions are single-crystalline so these regions cannot be grown on insulators such as oxide.

SUMMARY

A semiconductor device includes a monocrystalline substrate configured to form a channel region between two recesses in the substrate. A gate conductor is formed on a passivation layer over the channel region. Dielectric pads are formed in a bottom of the recesses and configured to prevent leakage to the substrate. Source and drain regions are formed in the recesses on the dielectric pads from a deposited non-crystalline n-type material with the source and drain regions making contact with the channel region.

Another semiconductor device includes a III-V monocrystalline substrate having a passivation layer formed thereon, the substrate being configured to form a channel region between two recesses in the substrate, the recesses forming undercut regions in the substrate below the passivation layer. A gate conductor is formed on the passivation layer over the channel region. Dielectric pads are formed in a bottom of the recesses between the undercut regions. The undercut regions are free from dielectric material of the dielectric pads. The dielectric pads are configured to prevent leakage to the substrate. Source and drain regions are formed from ZnO, which is deposited in the recesses over the dielectric pads. The source and drain regions make contact with the channel region.

A method for forming a transistor includes forming a passivation layer on a monocrystalline substrate; forming a gate conductor over a channel region of the substrate; etching recesses in the substrate through the gate dielectric, the recesses extending below a portion of the passivation layer in undercut regions; depositing a dielectric material that forms on the passivation layer, forms a gate cap material and forms dielectric pads in a bottom of the recesses; and forming source and drain regions in the recesses on the dielectric pads from an n-type material with the source and drain regions making contact with the channel region.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

In accordance with the present principles, devices and methods are provided that include forming devices with non-crystalline source and drain regions on a substrate. In useful embodiments, a doped n-type material is deposited on a dielectric material such as an oxide to form source/drain regions. The n-type material may include a II-VI material, such as zinc oxide (ZnO), indium tin oxide (ITO), indium zinc oxide (IZO), etc. The n-type material may be employed in an amorphous or polycrystalline state so that growth on a dielectric material is possible.

In one embodiment, a substrate material may include a high performance bulk III-V substrate. Recesses are formed in the substrate, and a dielectric layer is deposited in the recesses. Then, the n-type material is deposited on the dielectric layer and appropriately doped to form source and drain regions. The doping is preferably performed in-situ, e.g., using an atomic layer deposition (ALD) process. A channel region is formed in the substrate and provides the performance advantages of III-V material with reduced (ultra low) or eliminated substrate leakage. In one embodiment, the n-type material includes aluminum doped ZnO with a polycrystalline or amorphous structure, which performs well as a source/drain material.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may be includes in a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., ZnO. These compounds include different proportions of the elements within the compound, e.g., ZnO includes $Zn_xO_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 1:
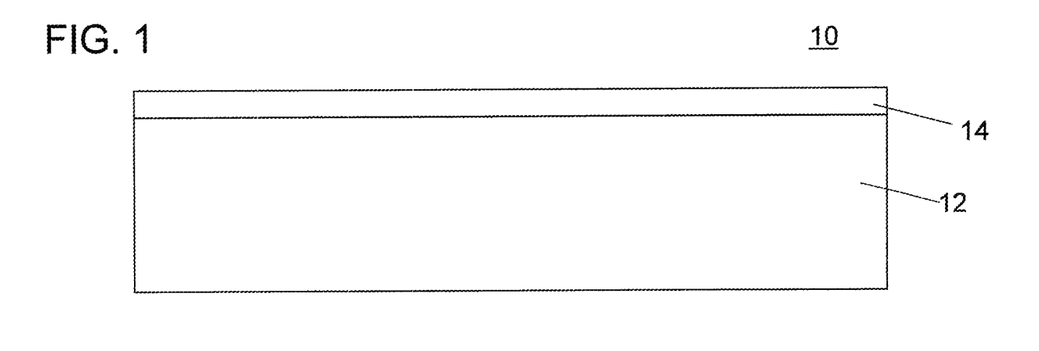
FIG. 1 is a cross-sectional view of a partially fabricated transistor device showing a passivation/gate dielectric layer formed on a monocrystalline substrate in accordance with the present principles.

Referring now to the drawings in which like numerals represent the same or similar elements and initially to FIG. 1, a partially fabricated metal oxide semiconductor field effect transistor (MOSFET) device 10 is shown in accordance with the present principles. The device 10 includes a substrate 12 having a passivation/gate dielectric layer 14 formed thereon. The substrate 12 may include any suitable substrate material. In useful embodiments, the substrate 12 includes a III-V material (e.g., InP, InGaAs, GaAs, etc.) or any other substrate material, e.g., Si, SiGe, SiC, Ge. In particularly useful embodiments, a III-V material is employed to obtain high speed, high mobility transistors.

The formation of the passivation layer 14 depends on the substrate material. In one embodiment, the substrate 12 includes InGaAs or GaAs. The passivation layer 14 may be formed by exposing the surface of the substrate 12 to activated sulfur (AS). The sulfur bonds to the substrate (Ga) to form the passivation layer. In another embodiment, amorphous Si (a-Si) may be formed on the surface of the substrate 12 and then exposed to activated sulfur to form the passivation layer 14. The passivation layer 14 is further processed to form a gate dielectric for the device 10. In one embodiment, the gate dielectric may include $Al_2O_3$ although other high-k dielectric materials may be employed. The $Al_2O_3$ of layer 14 may be deposited by an atomic layer deposition (ALD) process. Layer 14 is then subjected to a forming gas (FG) anneal process. Other processes may be employed to form the passivation layer 14, e.g., other materials, formation processes, anneal processes, etc.

Figure 2:
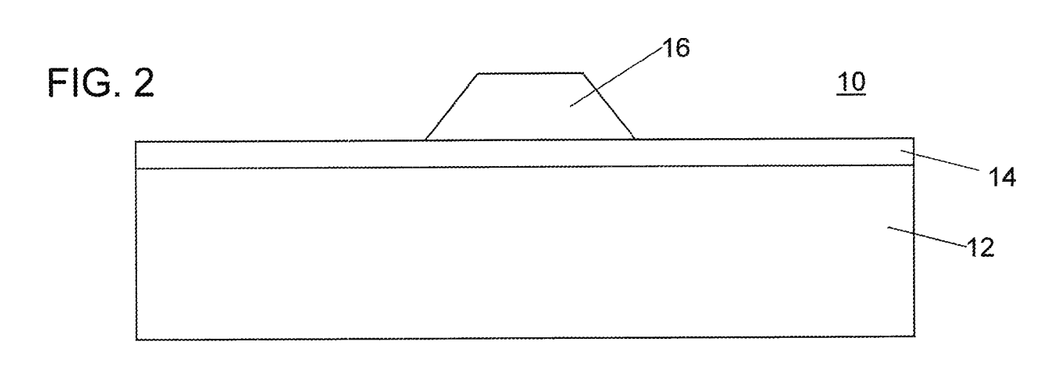
FIG. 2 is a cross-sectional view of the partially fabricated transistor device of FIG. 1 showing a gate conductor patterned on the passivation/gate dielectric layer and defining a position for a device channel region in accordance with the present principles.

Referring to FIG. 2, a gate conductor 16 is formed on the passivation layer 14. The gate conductor 16 may include any suitable material, with metals being preferred. In one embodiment, the gate conductor 16 includes Ti. The gate conductor 16 is deposited by, e.g., chemical vapor deposition (CVD), sputtering, evaporation, etc. In one embodiment, the gate conductor 16 illustratively includes Ti with a thickness of about 100 nm. Other materials and thicknesses may be employed. The gate conductor 16 may be patterned using any lithographic patterning technique. In one embodiment, the gate conductor 16 is patterned using a lift-off layer (LOL) gate lithography process.

The LOL process may include exposing and developing a resist (not shown) with the gate conductor pattern on the passivation layer 14. The resist is removed in the areas, where the target material is to be located, creating an inverse pattern. Target material (e.g., gate metal layer) is deposited (on the whole surface of the wafer). This layer covers the remaining resist as well as parts that were cleaned of the resist in the developing step. The resist is washed out together with parts of the target material covering it, only the material that was in the "holes" having direct contact with the underlying passivation layer 14 remains.

Figure 3:
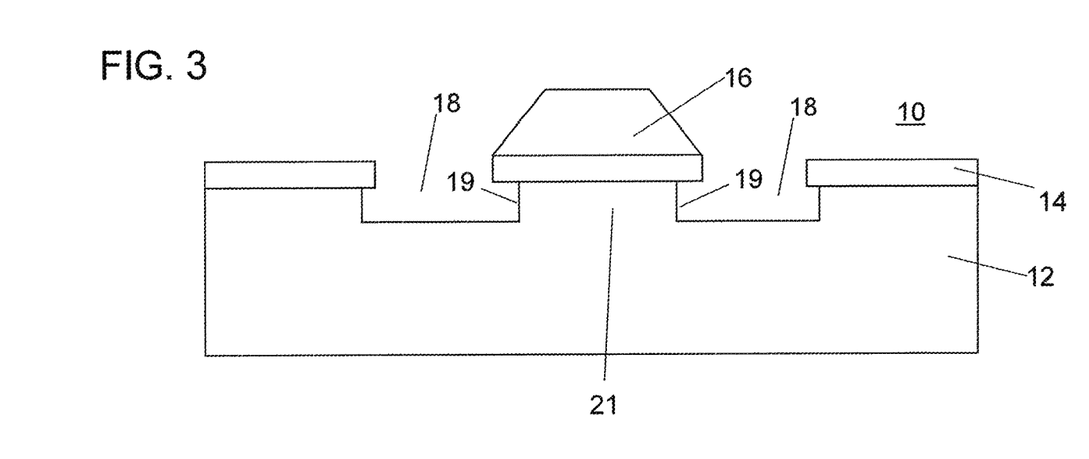
FIG. 3 is a cross-sectional view of the partially fabricated transistor device of FIG. 2 showing recesses formed on opposite sides of the gate conductor, the recesses being formed underneath overhanging portions of the passivation/gate dielectric layer (undercut regions) and defining the device channel region in accordance with the present principles.

Referring to FIG. 3, source and drain windows 18 are formed in the substrate 12. A lithographic process is employed to form an etch mask for etching the passivation layer/gate dielectric 14 and the material of the substrate 12. The etch process may include a dry etch process to open the passivation layer 14 and then to etch the substrate 12. A same etch process may be employed to etch both materials. In one embodiment, a reactive ion etch (RIE) is performed to open the passivation layer 14 and then a separate etch process is performed to form recesses in the substrate 12. Recesses 18 preferably extend below the passivation layer 14 under the gate conductor 16. The recesses 18 provide an exposed surface 19, which will be employed to access a channel region 21 under the gate conductor 16.

Figure 4:
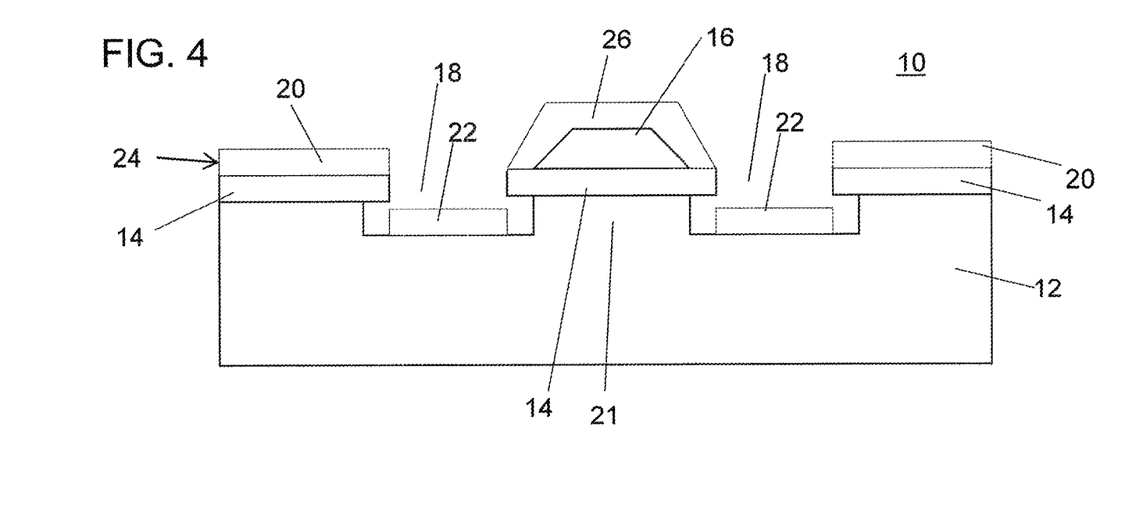
FIG. 4 is a cross-sectional view of the partially fabricated transistor device of FIG. 3 showing a dielectric material deposited over the surface of the device on the passivation/gate dielectric layer, and forming a gate cap dielectric on the gate conductor and forming dielectric pads on bottoms of the recesses but not underneath the overhanging portions of the passivation/gate dielectric layer (undercut regions) in accordance with the present principles.

Referring to FIG. 4, the gate conductor 16 is resized to better correspond with the channel region 21. A partial etch to the gate conductor 16 may be employed to reduce its thickness and width (e.g., Ti may be reduced to a thickness of about 50 nm). This also provides space on the passivation layer 14 that forms a landing below the gate conductor 16. This space is employed to permit formation of a gate cap dielectric 26 from a dielectric material 24 deposited over the device 10. Since e.g., 50 nm of gate conductor 16 is removed, the gate conductor material 16 can be replaced by 50 nm of dielectric material 26.

In one embodiment, the dielectric material 24 is formed by an evaporation process at about a 90 degree incidence (e.g., straight on (normal to the surface)). This forms the dielectric material 24 at bottoms (not sides) of the recesses 18. The dielectric material 24 being deposited forms pads 22 that clear the overhang of the passivation layer 14 but do not form along sidewalls of the recesses 18. It should be noted that other angles of incidence may be employed to move a position of the dielectric pads 22 within the recesses 18.

The dielectric material 24 is also formed as regions 20 on the passivation layer 14. In addition, as described, the dielectric material 24 covers the gate conductor 16 to form gate cap dielectric 26. The dielectric material 24 may include an oxide, e.g., a silicon oxide, although other dielectric materials may be employed.

Figure 5:
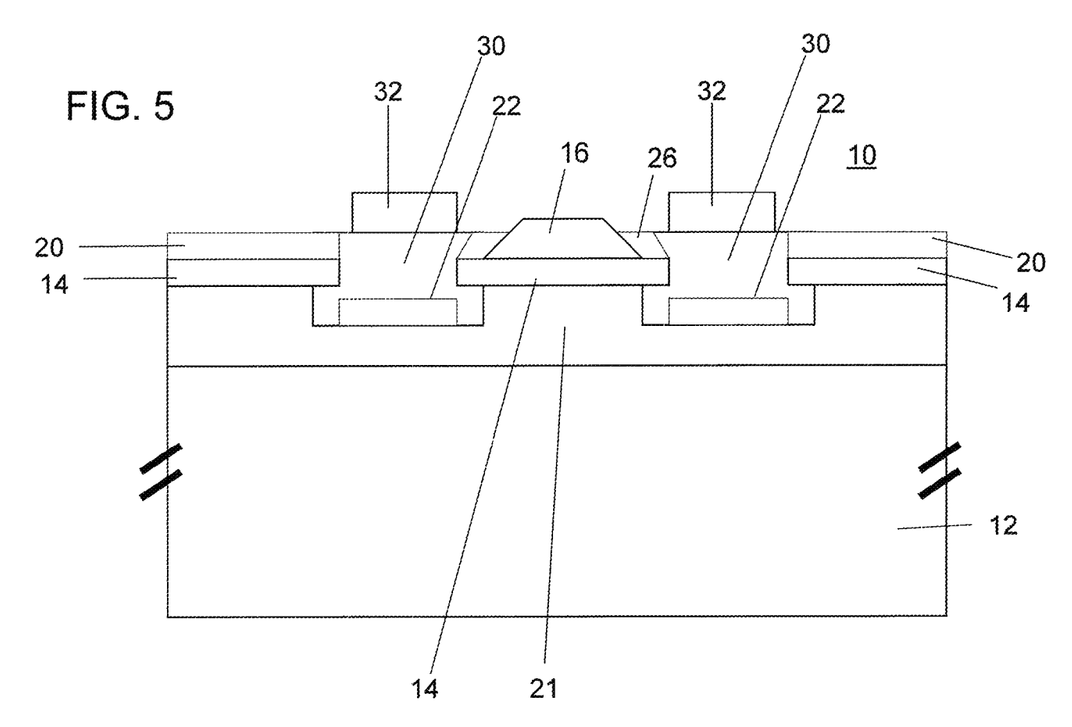
FIG. 5 is a cross-sectional view of the partially fabricated transistor device of FIG. 4 showing source and drain regions formed in the recesses and making contact on a sidewall with the device channel region (in the undercut region on one side of the recess) in accordance with the present principles.

Referring to FIG. 5, a deposition process is employed to form source and drain regions 30 of the device 10. The source and drain regions 30 are formed from an n-type material formed in the recesses 18. The n-type material may be deposited using a chemical vapor deposition, atomic layer deposition (ALD), evaporation process or any other suitable technique. The n-type material preferably includes a II-VI material, such as ZnO, ZnS, ZnSe, CdS, CdTe, etc. In useful embodiments, the n-type material includes ZnO, indium tin oxide (ITO), indium zinc oxide (IZO), etc. In one particularly useful embodiment, the n-type material includes Al doped ZnO (ZnO:Al or AZO).

The n-type material is deposited in the recesses 18 to fill the recesses 18 and to make contact with the surfaces 19 of the device channel region 21. The n-type material forms over and buries dielectric pads 22. The n-type material fills below the overhang of the passivation layer 14 into the recesses 18. The n-type material is formed over the gate cap dielectric 26.

A lithographic technique is employed to mask the source and drain regions 30 and remove the n-type material from dielectric regions 20 and from the over the gate cap dielectric 26 using an etch process, e.g., a wet or dry etch.

The formation of source and drain regions 30 from e.g., ZnO:Al, may be provided using atomic layer deposition (ALD), although other processes may be employed. This permits a doped layer with less surface damage. In accordance with the present principles, a range of n-doping in ZnO of source and drain regions 30 may be up to 2 atomic percent (e.g., $\sim 5 \times 10^{21}/cm^3$). ZnO dopants may include Al, B, Ga, In, etc., with ZnO:Al being preferred. The carrier concentration (electron density) of the source and drain regions 30 may be between about $1 \times 10^{21}$ cm$^{-3}$ to about $5 \times 10^{21}$ cm$^{-3}$, and preferably about $3.0 \times 10^{21}$ cm$^{-3}$ for ZnO:Al (AZO).

The n-type material (e.g., ZnO:Al) for source and drain regions 30 may be crystalline in form. This includes a monocrystalline structure and may include a multi-crystal structure or other crystalline structure (micro, nano, etc.). However, the AZO material may also include amorphous phases, which can be easily grown on or over dielectric materials (e.g., pads 22). In one embodiment, the ZnO of source and drain regions 30 is amorphous.

Next, another lithography process may be employed to expose and etch the gate cap dielectric 26. A reactive ion etch (RIE) may be employed to remove the gate cap dielectric 26 over the gate conductor 16 but maintain dielectric material 24 between the gate conductor 16 and the source and drain regions 30.

Processing continues by providing electrical connections to the source and drain regions 30 and the gate conductor 16. The electrical connections are preferably in the form of contacts 30 and metal lines (not shown), etc. For example, another lithography is employed to open contact holes in a dielectric material (not shown) and deposit material for the contacts 32 on the source and drain regions 30. The contacts 30 may include any suitable metal, e.g., W, Ti, Pd, Pt, Ag, Au, Cu, etc.

In accordance with the present principles, a field effect transistor 10 is provided that employs deposited n-type II-VI material on dielectric material (pads 22). The device leakage to the substrate is reduced (ultra low) or eliminated as a result of forming the source ad drain regions 30 on the dielectric pads 22. The source and drain regions 30 make contact with the channel region 21 below the gate conductor 16. The pads 22 prevent leakage down into the substrate 12. In accordance with the present principles, the advantages of the high mobility device channel 21 are provided without loss of performance due to leakage to the substrate 12. The present principles have been described in accordance with a particular MOSFET design; however, other designs and structures may also be employed.

Figure 6:
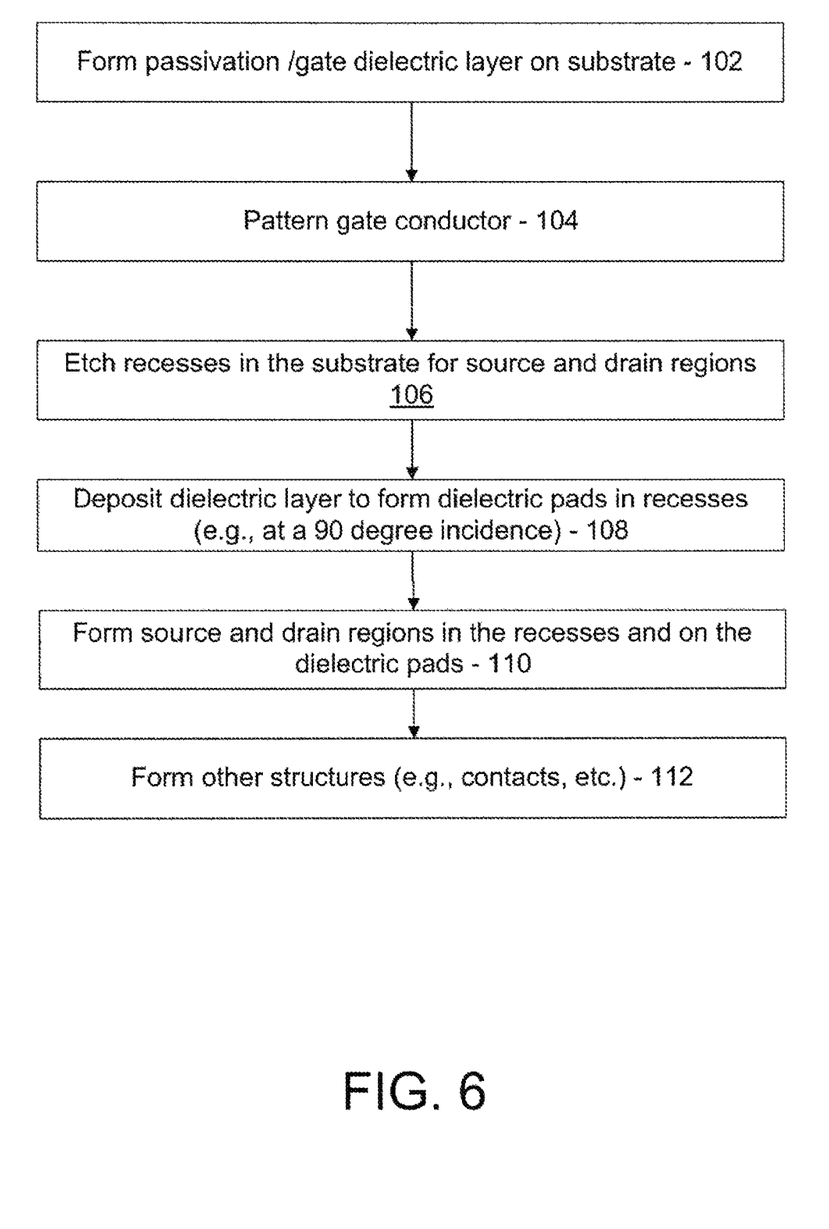
FIG. 6 is a block/flow diagram showing a method for forming a transistor in accordance with illustrative embodiments.

Referring to FIG. 6, methods for forming a transistor are illustratively shown in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a passivation layer/gate dielectric layer is formed on a monocrystalline substrate. This may include depositing a high-K dielectric material such as aluminum oxide, hafnium oxide, etc. Depending on the material, the surface of the substrate may be passivated prior to forming the gate dielectric layer, e.g., using a sulfur activation process or an a-Si deposition and sulfur activation process. The high-K dielectric material may be deposited using ALD and annealing the layer after formation.

In block 104, a gate conductor is formed over a channel region of the substrate. The gate conductor may include a metal, such as W, Ti, etc. The gate conductor may be patterned suing a lift-off layer lithography process, although other patterning processes may be employed. In block 106, recesses are etched into the substrate through the gate dielectric. The recesses extend below a portion of the passivation layer in undercut regions. The undercut region laterally extends further into the substrate than the passivation layer opening. The etching process may include a RIE to open the passivation layer followed by isotropic wet or dry etch.

In block 108, a dielectric material is deposited on the passivation layer, to form a gate cap material and to form dielectric pads in a bottom of the recesses. In one embodiment, the n-type material is evaporated at a 90 degree incidence to prevent dielectric material from forming on sidewalls of the recesses. The angle of incidence may be shifted +/−10 degrees or as needed.

In block 110, source and drain regions are formed in the recesses on the dielectric pads from a non-crystalline n-type material with the source and drain regions making contact with the channel region. In one embodiment, the n-type material includes Al-doped ZnO. The n-type material is preferably deposited directly on the dielectric pads to form the source and drain regions, e.g., by ALD. In one embodiment, the n-type material includes an amorphous phase. Since the n-type material does not need to have a crystalline structure, flexibility in device fabrication is achieved.

In block 112, contacts and metallizations are formed to make electrical connections to the source, drain and gate regions as needed. Processing continues to complete the device.

Having described preferred embodiments for MOSFET with ultra low drain leakage (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming a transistor, comprising:
   forming a passivation layer on a monocrystalline substrate;
   forming a gate conductor on the passivation layer over a portion of the substrate to define a channel region;
   etching recesses in the substrate through the passivation layer on opposite sides of the channel region, each of the recesses extending below a portion of the passivation layer to form undercut regions below the gate conductor and below the passivation layer on a side opposite the undercut region below the gate conductor;
   depositing a dielectric material to form a dielectric pad on a bottom of each of the recesses, wherein each of the dielectric pads does not contact the sidewalls in the undercut regions; and
   forming an n-type source/drain material in each of the recesses, wherein the source/drain material is formed on one of the dielectric pads, and the source/drain material makes contact with the recess sidewalls in the undercut regions.

2. The method as recited in claim 1, wherein the n-type source/drain material includes Al-doped ZnO.

3. The method as recited in claim 1, wherein the dielectric material is evaporated at a 90 degree incidence to prevent the dielectric material from forming on the sidewalls of the recesses.

4. The method as recited in claim 1, wherein the n-type material is deposited directly on the dielectric pads.

5. The method as recited in claim 1, wherein forming the source/drain material utilizes atomic layer deposition.

6. The method as recited in claim 1, wherein the n-type material includes an amorphous phase.

7. The method as recited in claim 1, wherein the dielectric pads cover only a portion of the bottom of each of the recesses, and the n-type source/drain material covers a portion of the bottom of each of the recesses.

8. The method as recited in claim 7, wherein the passivation layer masks a portion of the bottom of each of the recesses.

9. The method as recited in claim 1, wherein depositing the dielectric material further forms a gate cap dielectric on a portion of the gate conductor.

10. The method as recited in claim 9, wherein the gate cap dielectric is also on a portion of the passivation layer.

11. A method for forming a transistor, comprising:
    forming a passivation layer on a substrate;
    patterning the passivation layer to expose portions of the substrate on opposite sides of a channel region;
    forming a gate conductor on the passivation layer over the channel region;
    etching recesses in the substrate, wherein a portion of each of the recesses extends below a portion of the passivation layer to form undercut regions below the passivation layer;
    depositing a dielectric material on a portion of the bottom of each of the recesses to form a dielectric pad, wherein the passivation layer masks a portion of each of the recesses, and the dielectric material is evaporated at a 90 degree incidence, so the dielectric material does not contact the sidewalls in the undercut regions; and
    forming a source/drain material in each of the recesses.

12. The method as recited in claim 11, wherein the source/drain material is an amorphous n-type material.

13. The method as recited in claim 12, wherein the substrate is a III-V material.

14. The method as recited in claim 11, further comprising patterning the gate conductor, wherein the gate conductor is patterned using a lift-off layer (LOL) gate lithography process.

15. The method as recited in claim 11, wherein the source/drain material contacts a bottom surface of the recesses and a sidewall adjacent to the channel region.

16. A method for forming a transistor, comprising:
    forming a passivation layer on a monocrystalline substrate;
    forming a gate conductor on the passivation layer;

removing portions of the passivation layer on opposite sides of the gate conductor to expose portions of the monocrystalline substrate;

etching recesses in the substrate on opposite sides of the gate conductor, wherein a portion of each of the recesses extends below a portion of the gate conductor, and defines a channel region between the recesses and below the gate conductor;

depositing a dielectric material on a portion of the bottom surface of each of the recesses to form a dielectric pad in each of the recesses, wherein each of the dielectric pads are not in contact with the sidewall surface of the recess; and depositing source/drain material in each of the recesses in contact with the bottom surface and the sidewall surface of the recess.

17. The method as recited in claim 16, wherein the channel region is a III-V material, and the source/drain material in each of the recesses is a II-VI material.

18. The method as recited in claim 16, wherein the source/drain material is deposited by atomic layer deposition (ALD).

19. The method as recited in claim 16, wherein the source/drain material is crystalline.

20. The method as recited in claim 16, further comprising forming an electrical contact on each of the source/drain material in each of the recesses.

\* \* \* \* \*